United States Patent
Luoh et al.

(10) Patent No.: US 9,869,712 B2
(45) Date of Patent: Jan. 16, 2018

(54) METHOD AND SYSTEM FOR DETECTING DEFECTS OF WAFER BY WAFER SORT

(71) Applicant: MACRONIX International Co., Ltd., Hsinchu (TW)

(72) Inventors: Tuung Luoh, Hsinchu (TW); I-Jen Huang, Hsinchu (TW); Ling-Wuu Yang, Hsinchu (TW); Ta-Hone Yang, Hsinchu (TW); Kuang-Chao Chen, Hsinchu (TW)

(73) Assignee: MACRONIX International Co., Ltd., Hsinchu (TW)

( * ) Notice: Subject to any disclaimer, the term of this patent is extended or adjusted under 35 U.S.C. 154(b) by 286 days.

(21) Appl. No.: 14/694,017

(22) Filed: Apr. 23, 2015

(65) Prior Publication Data

US 2016/0314237 A1  Oct. 27, 2016

(51) Int. Cl.
*G06F 17/50* (2006.01)
*G01R 31/28* (2006.01)
*G01R 31/265* (2006.01)

(52) U.S. Cl.
CPC ..... *G01R 31/2831* (2013.01); *G01R 31/2653* (2013.01)

(58) Field of Classification Search
CPC .................. G01R 31/2831; G01R 31/2653
USPC .................................................. 716/112
See application file for complete search history.

(56) References Cited

U.S. PATENT DOCUMENTS

| | | | | |
|---|---|---|---|---|
| 7,676,077 B2 * | 3/2010 | Kulkarni | ........... | G06F 17/5045 382/144 |
| 8,122,392 B2 * | 2/2012 | White | ........... | G06F 17/5068 716/112 |
| 9,305,664 B2 * | 4/2016 | Pious | ........... | G11C 29/44 |

* cited by examiner

*Primary Examiner* — Jack Chiang
*Assistant Examiner* — Brandon Bowers
(74) *Attorney, Agent, or Firm* — J.C. Patents

(57) ABSTRACT

A method for detecting defects of wafer by wafer sort is introduced. In the method, a wafer sort testing apparatus is used to obtain a DTL or ADART result, wherein a plurality of repaired sites in a wafer is highlighted according to the DTL or ADART result. A plurality of physical locations of the repaired sites is then output. An analysis equipment is used to match the physical locations with a graphic data system (GDS) design layout coordinate of the wafer so as to generate a data correlating with defects at the repaired sites.

27 Claims, 8 Drawing Sheets

METHOD AND SYSTEM FOR DETECTING DEFECTS OF WAFER BY WAFER SORT

BACKGROUND OF THE INVENTION

Field of the Invention

The invention relates to a defect inspection methodology; more particular, the invention relates to a method and a system for detecting defects of a wafer by water sort (WS).

Description of Related Art

In the semiconductor process, all integrated circuits on the wafer have to be tested to increase the product yield. For example, the wafer testing is performed by a piece of test equipment called a wafer prober. The process of wafer testing can be referred to in several ways: Wafer Sort (WS), Wafer Final Test (WFT), Electronic Die Sort (EDS) and Circuit Probe (CP) are probably the most common.

The WS repair function makes most of failure sites being repaired, and then there is no exactly site to match. In addition, WS reports only shows Die base (by die, not by sites), so it is hard to match defects. Furthermore, WS results are hard to match real defects unless the wafer is worse and low yield, and thus it is also hard to calculate the killing ratio vs. defect by layers.

SUMMARY OF THE INVENTION

The invention is directed to a method for detecting defects of wafer by wafer sort to be easy to match defects.

The invention is further directed to a method for detecting defects of wafer by wafer sort to get the killing ratio and further finding out the yield impact layers and defect of interest (DOI).

The invention is further directed to a system to detect defects of wafer and resolve some issue hidden in huge database.

In an embodiment of the invention, a method for detecting defects of the wafer by wafer sort (WS) is provided. In the method, a DTL ADART result is obtained by using a WS testing apparatus, wherein a plurality of repaired sites in the wafer is highlighted according to the DTL or ADART result (step a). A plurality of physical locations of the repaired sites is output (step b). The physical locations are matched with a graphic data system (GDS) design layout coordinate of the wafer by using an analysis equipment, and thereby generating a data correlating with defects at the repaired sites (step c).

According to an embodiment of the invention, the GDS design layout coordinate is in form of GDSII or OASIS coordinates.

According to an embodiment of the invention, each of the repaired sites includes at least one sector.

According to an embodiment of the invention, the method further includes repeating steps a-c to detect the defects at different layers of the wafer.

According to an embodiment of the invention, the method farther includes repeating steps a-b to detect the defects at same layer of the wafer in different lots.

According to an embodiment of the invention, the method further includes repeating steps a-c to detect the defects at same site of different layers by batch run, and then highlighting a superposition site with different failure repair bin.

According to an embodiment of the invention, the data correlating with the defects at the repaired sites includes a killing ratio by comparing an amount of the repaired sites having same failure to the total number of the repaired sites.

According to an embodiment of the invention, the data correlating with the defects at the repaired sites includes pattern of interest (POI) and DOI.

According to an embodiment of the invention, the method further includes displaying with repair signature at step a.

According to an embodiment of the invention, the method further includes displaying with defect signature at step a.

In another embodiment of the invention, a method for detecting defects of wafer by wafer sort is introduced. In the method, a plurality of raw images of a wafer is obtained by using an E-beam inspection apparatus (step a). A plurality of physical coordinates within the wafer is output by decoding a plurality of locations of the raw images (step b). A DTL or ADART result is obtained by using a wafer sort testing apparatus, wherein a plurality of repaired sites in the wafer is highlighted according to the DTL or ADART result (step c). A plurality of physical locations of the repaired sites is output (step d). The physical coordinates within the wafer are matched with the physical locations of the repaired sites using an analysis equipment so as to generate a data correlating with defects at the repaired sites (step e).

According to another embodiment of the invention, the physical coordinates are in form of GDSII or OASIS coordinates.

According to another embodiment of the invention, each of the repaired sites includes at least one sector.

According to another embodiment of the invention, the method further includes repeating steps a-c to detect the defects at different layers of the wafer.

According to another embodiment of the invention, the method further includes repeating steps a-e to detect the defects at same layer of the wafer in different lots.

According to another embodiment of the invention, the method further includes repeating steps a-e to detect the defects at same site of different layers by batch run, and then highlighting a superposition site with different failure repair bin.

According to another embodiment of the invention, the data correlating with the defects at the repaired sites includes a killing ratio by comparing an amount of the repaired sites having same failure to the total number of the repaired sites.

According to another embodiment of the invention, the data correlating with the defects at the repaired sites includes POI and DOI after step e.

According to another embodiment of the invention, the method further includes displaying with repair signature at step c.

According to another embodiment of the invention, the method further includes displaying with defect signature at step c.

According to another embodiment of the invention, the E-beam inspection apparatus includes an E-beam inspection tool, a bright field inspection equipment with a light source having a wavelength of 150 nm to 800 nm, a dark field inspection equipment with a laser light source, or a scanning electron microscope review tool.

In yet another embodiment of the invention, a system for detecting defects of a wafer is provided. The system includes a wafer sort (WS) testing apparatus, an analysis equipment, and a design layout database unit. The design layout database unit stores a graphic data system (GDS) design layout coordinate of the wafer. The analysis equipment is coupled to the design layout database unit. The WS testing apparatus is coupled to the analysis equipment and includes at least a wafer prober, a data processing module and an output module. The data processing module is coupled to the wafer prober and the output module. The wafer prober tests a wafer to get a DTL or ADART result, and the data processing module highlights a plurality of repaired sites in the wafer according to the DTL or ADART result. The output module is coupled to the data processing module and outputting a plurality of physical locations of the repaired sites into the analysis equipment, such that the analysis equipment performing a step of matching the GDS design layout coordinate with the physical locations of the repaired sites so as to generate a data correlating with defects at the repaired sites.

According to yet another embodiment of the invention, the GDS design layout coordinate is in form of GDSII or OASIS coordinates.

According to yet another embodiment of the invention, each of the repaired sites includes at least one sector.

According to yet another embodiment of the invention, the data correlating with the defects at the repaired sites comprises a killing ratio by comparing an amount of the repaired sites having same failure to the total number of the repaired sites.

According to yet another embodiment of the invention, the data correlating with the defects at the repaired sites comprises pattern of interest (POI) and defect of interest (DOI).

According to yet another embodiment of the invention, the WS testing apparatus further comprising a display coupled to the data processing module and displaying with a repair signature and a defect signature.

According to yet another embodiment of the invention, the system further includes an E-beam inspection apparatus coupled to the analysis equipment, the E-beam inspection apparatus obtains a plurality of raw images of the wafer and outputs a plurality of physical coordinates within the wafer into the analysis equipment by decoding a plurality of locations of the raw images.

According to yet another embodiment of the invention, the E-beams inspection apparatus includes an E-beam inspection tool, a bright field inspection equipment with a light source having a wavelength of 150 nm to 800 nm, a dark field inspection equipment with a laser light source, or a scanning electron microscope review tool.

Based on above, the invention is capable of getting the repair sites vs. defect correlation and the repair bin vs. killing ratio, such that the yield impact layers and DOI may be found out. Moreover, WS testing is performed in the invention, so there is no need to set up other testing recipe. Since each of repaired sites according to WS is ranged in few sectors, it may be easy to pixelize and then match with signature.

It is to be understood that both the foregoing general description and the following detailed description are exemplary, and are not intended to limit the scope of the invention.

BRIEF DESCRIPTION OF THE DRAWINGS

The accompanying drawings are included to provide further understanding, and are incorporated in and constitute a part of this specification. The drawings illustrate exemplary embodiments and, together with the description, serve to explain the principles of the invention.

DETAILED DESCRIPTION OF DISCLOSED EMBODIMENTS

Figure 1:
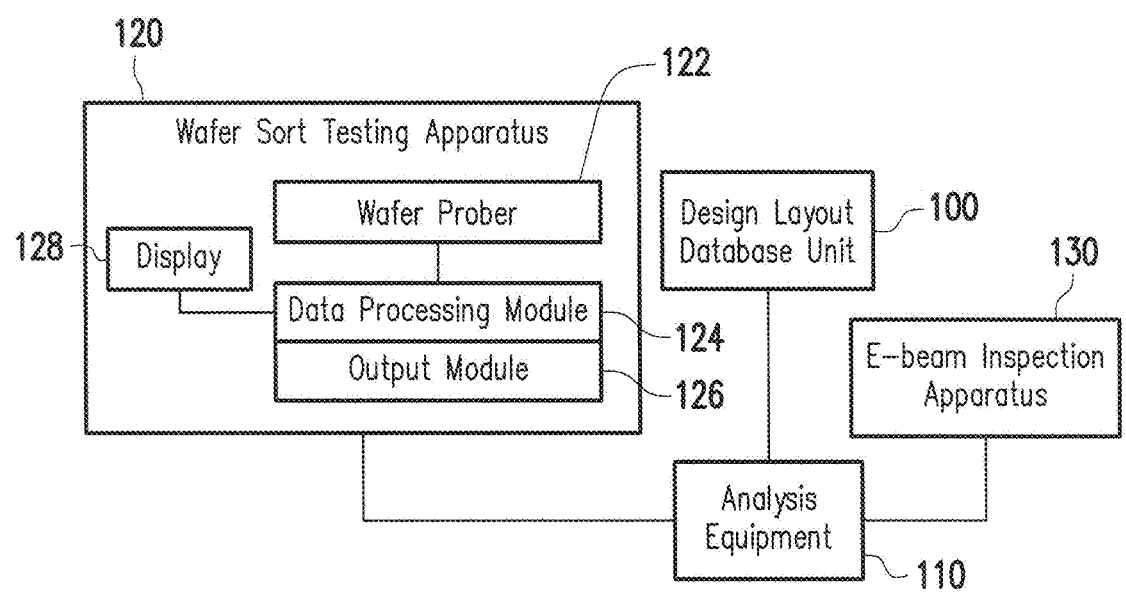
FIG. 1 is a block diagram illustrating system of detecting defects of wafer according to an embodiment of the invention.

FIG. 1 is a block diagram illustrating a system of detecting defects of wafer according to an embodiment of the invention. With reference to FIG. 1, a system 10 includes a design layout database unit 100, an analysis equipment 110 and a wafer sort (WS) testing apparatus 120. In this embodiment, the design layout database unit 100 stores a graphic data system (GDS) design layout coordinate of the wafer, wherein the GDS design layout coordinate is in form of GDSII or OASIS coordinates, for example. The analysis equipment 110 is coupled to the design layout database unit 100 and the WS testing apparatus 120, wherein the analysis equipment 110. The WS testing apparatus 120 includes at least a wafer prober 122, a data processing module 124 and an output module 126. The data processing module 124 is coupled to the wafer prober 122 and the output module 126. When the wafer prober 122 tests a wafer and then get a DTL or ADART result, the data processing module 124 may highlight a plurality of repaired sites in the wafer according to the DTL or ADART result, wherein each of the repaired sites may include at least one sector or some sectors.

In this embodiment, the output module 126 outputs a plurality of physical locations of the repaired sites into the analysis equipment 110, and the analysis equipment 110 will perform a step of matching the GDS design layout coordinate from the design layout database unit 100 with the physical locations of the repaired sites so as to generate a data correlating with defects at the repaired sites. The data correlating with the defects at the repaired sites, for instance, includes a killing ratio by comparing an amount of the repaired sites having same failure to the total number of the repaired sites. Alternatively, the data correlating with the defects at the repaired sites may be pattern of interest (POI) and defect of interest (DOI).

With reference to FIG. 1, the WS testing apparatus 120 may further includes display 128 coupled to the data processing module 124, and the display 128 shows a repair signature and a defect signature from the DTL or ADART result. In addition, the system 10 may include an E-beam inspection apparatus 130 coupled to the analysis equipment 110, such that the E-beam inspection apparatus 130 obtains a plurality of raw images of the wafer and outputs a plurality of physical coordinates within the wafer into the analysis equipment 110 by decoding a plurality of locations of the raw images. For example, the E-beam inspection apparatus 130 includes an E-beam inspection tool, a bright field inspection equipment with a light source having a wavelength of 150 nm to 800 nm, a dark field inspection equipment with a laser light source, or a scanning electron microscope review tool.

Figure 2:
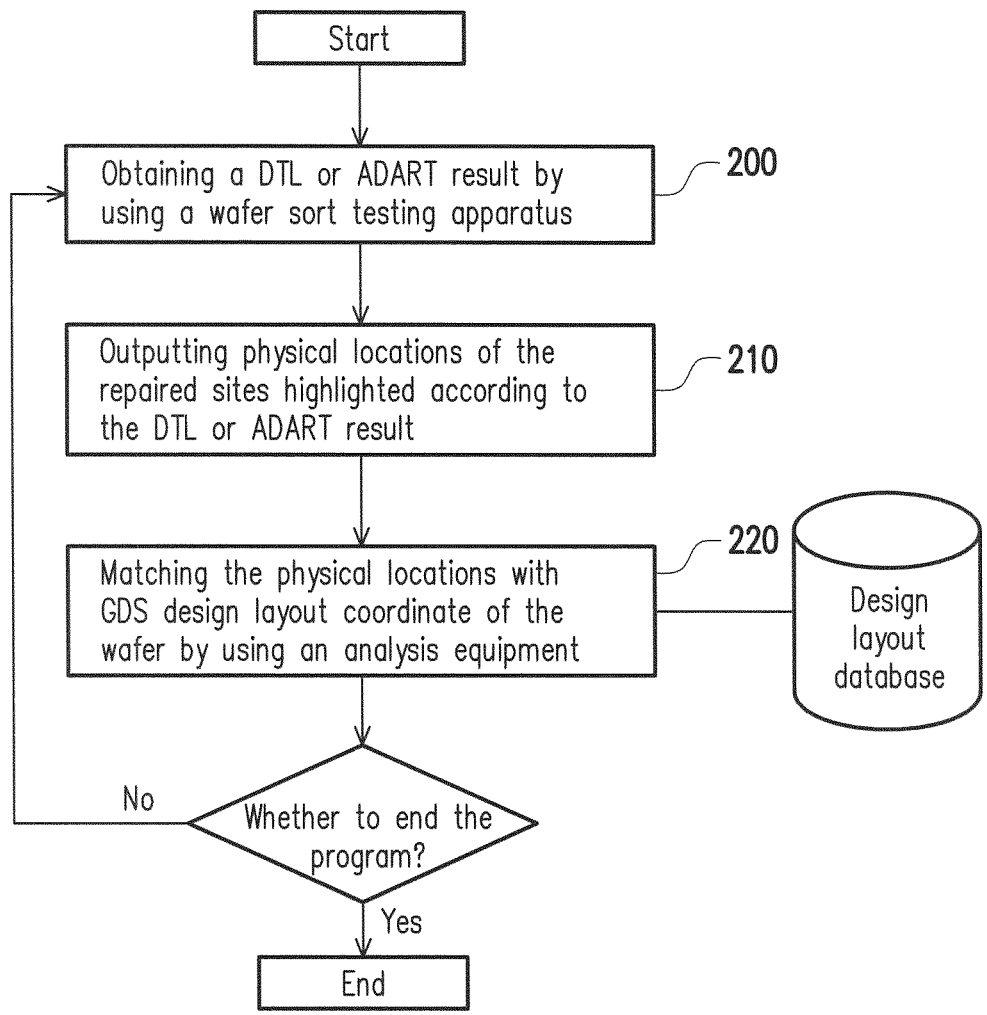
FIG. 2 is a diagram illustrating steps of detecting defects of wafer by wafer sort (WS) according to an embodiment of the invention.

FIG. 2 is a diagram illustrating steps of detecting defects of wafer by wafer sort (WS) according to an embodiment of the invention.

With reference to FIG. 2, step 200 is performed to obtain a DTL or ADART result by using a wafer sort (WS) testing apparatus such as wafer prober and the like. The repaired sites in the wafer are highlighted according to the DTL or ADART result. Each of the repaired sites, for instance, includes at least one sector, or few sectors. Before the step 200, DTL repair rule and format can be defined. In response to the step 200, repair signature or/and defect signature can be displayed. For example, WS Bin failure signature (i.e. defect signature) will be reported by different color, and one color represents one type of defects. For example, the defects may be Cu pits, blind contact, residue, false, pre-layer, etc.

Figure 3:
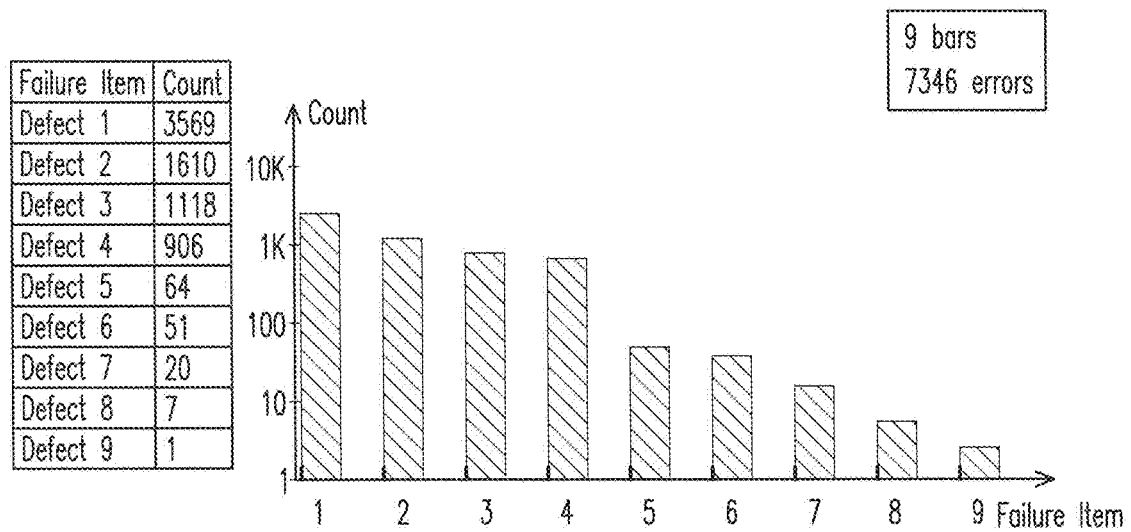
FIG. 3 is a bar diagram illustrating the WS Failure Bin by sector with signature in the embodiment of the invention.

Besides, the defect signature may be accumulated into one and/or split up into different defect types or same defect from different layers. Furthermore, all defects can be categorized into a bar chart as shown in FIG. 3. In FIG. 3, the type of defects contains nine types (Defect 1-9) and 7346 errors are detected. According to different type of defects, there are different colors to display in separate wafer maps.

As to the repaired sites, the exemplary description is as follows. The format of DTL is so-called "%XXZZZ_value_cyc", wherein XX is Bin Code, ZZZ is Repair Flag, value indicates a sector or BL (bit line), and All Cyc=0. In the case of Y-repair, DTL 310-437 respectively mean one sector or array column (310-437 are respectively from $1^{st}$ group to $128^{th}$ group); DTL 438 means the numbers of Y-repair at single item; and DTL 439 means the numbers of Y-repair at total items. Hence, if the DTL format is, for instance, "%38437 107 0", it means that the $128^{th}$ group shall be repaired in the Bind Code 38.

In the case of X-repair, DTL 440-454 respectively mean one sector (440-454 are respectively from $1^{st}$ group to $15^{th}$ group); DTL 455 means the numbers of X-repair at single item; DTL 456 means the numbers of X-repair at total items; DTL 457 means the rest number of usable X-repair; DTL 458 means X-repair mark; and DTL 459 means X-repair disable. Hence, if the DTL format is, for instance, "%38440 48 0", it means that the $1^{st}$ group shall be repaired in $48^{th}$ sector.

Figure 4:
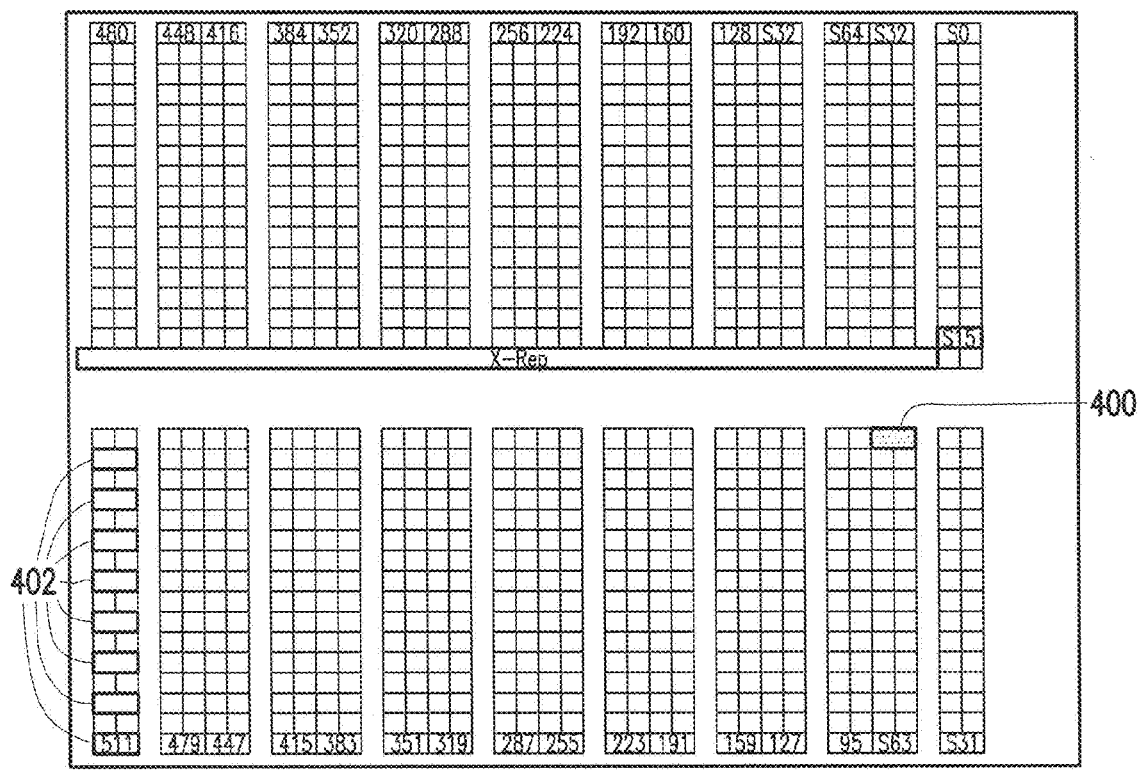
FIG. 4 is a diagram illustrating the repaired sites in X-axis and Y-axis.

If each group of Y-repair includes 8 sectors and each group of X-repair includes 1 sector, the repaired sites will be shown in FIG. 4. In FIG. 4, the dotted region 400 is repaired site in X-axis, and the regions 402 are repaired sites in Y-axis.

In step 210, physical locations of the repaired sites are output. In detail, the DTL or ADART result includes the data about physical locations of the repaired sites; hence, the coordinates of the physical locations of the repaired sites are output. In WS, the output physical location is also called 'Failure Bin' of the repaired sites.

Figure 5:
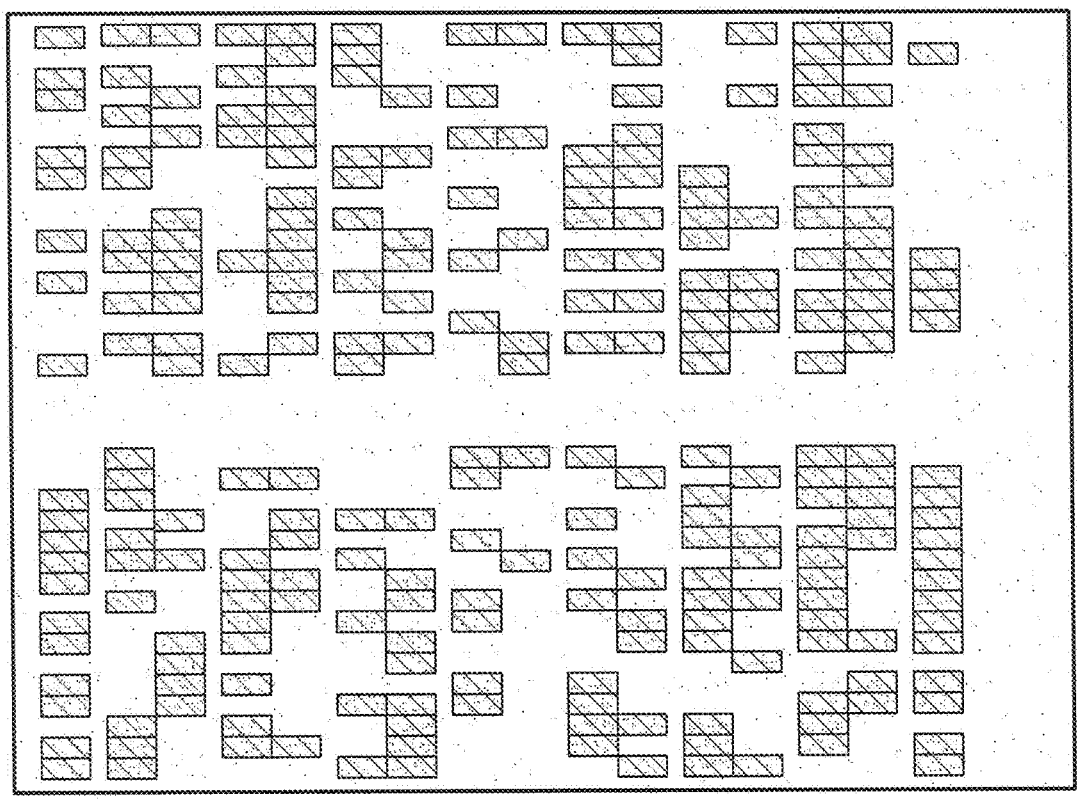
FIG. 5 is a diagram illustrating defects in the physical locations matching with the repaired sites.

In step 220, the physical locations are matched with a graphic data system (GDS) design layout coordinate of the wafer by using an analysis equipment, and thereby generating a data correlating with defects at the repaired sites. In addition, the defects are generally scanned at specific machine item of wafer fabrication before the step 200. Therefore, the defects (shown as points) in the physical locations may be matched with the repaired sites as shown in FIG. 5. The GDS design layout coordinate is applied from design layout database in form of GDS or OASIS coordinates, for example. The design layout database includes a GDS file of a source design database, a GDS file of a simulated post-optical proximity correction, or a design database converted from a simulated tool and so on. In the embodiment, the data correlating with the defects at the repaired sites may be a killing ratio, which is compared an amount of the repaired sites having same failure to the total number of the repaired sites. In other words, the killing ratio is a defect-generation rate resulting in the repaired sites. Optionally, the data correlating with the defects at the repaired sites may be pattern of interest (POI) and defect of interest (DOI).

After the step 220, the program may he ended, but it is not limited herein. In necessary, the steps 200-210 or 200-220 may be repeated to perform several inspections.

Figure 6:
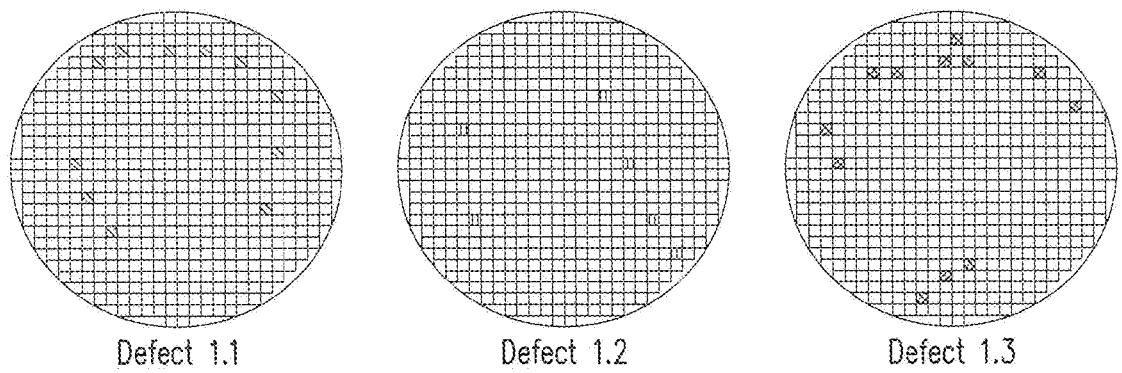
FIG. 6 is a diagram illustrating three wafers with defect signature.

In one exemplary embodiment, the steps 200-220 may be repeated several times to detect the defects at different layers of the same wafer. In another exemplary embodiment, the steps 200-210 may be repeated at least one time to detect the defects at same layer of the wafer in different lots, as shown in FIG. 6. FIG. 6 shows three wafers with defect signature, wherein Defect 'Defect 1.1' mans the first type defect in the first lot, 'Defect 1.2' mans the first type defect in the second lot, and 'Defect 1.3' mans the first type defect in the third lot. Besides, the defect signature in the three wafers may be accumulated together through different colors.

In yet another embodiment, the steps 200-220 may be repeated to detect the defects at same site of different layers by batch run, and then highlighting superposition sites with different failure repair bin.

In still another embodiment, the steps 200-220 may be repeated to detect and match the different defects with respect to different layers in the same lot.

Since the method of the embodiment of the invention can get the repair sites vs. defect correlation, the repair bin vs. killing ratio, and thus the yield impact layers and the DOI may be found out.

Figure 7:
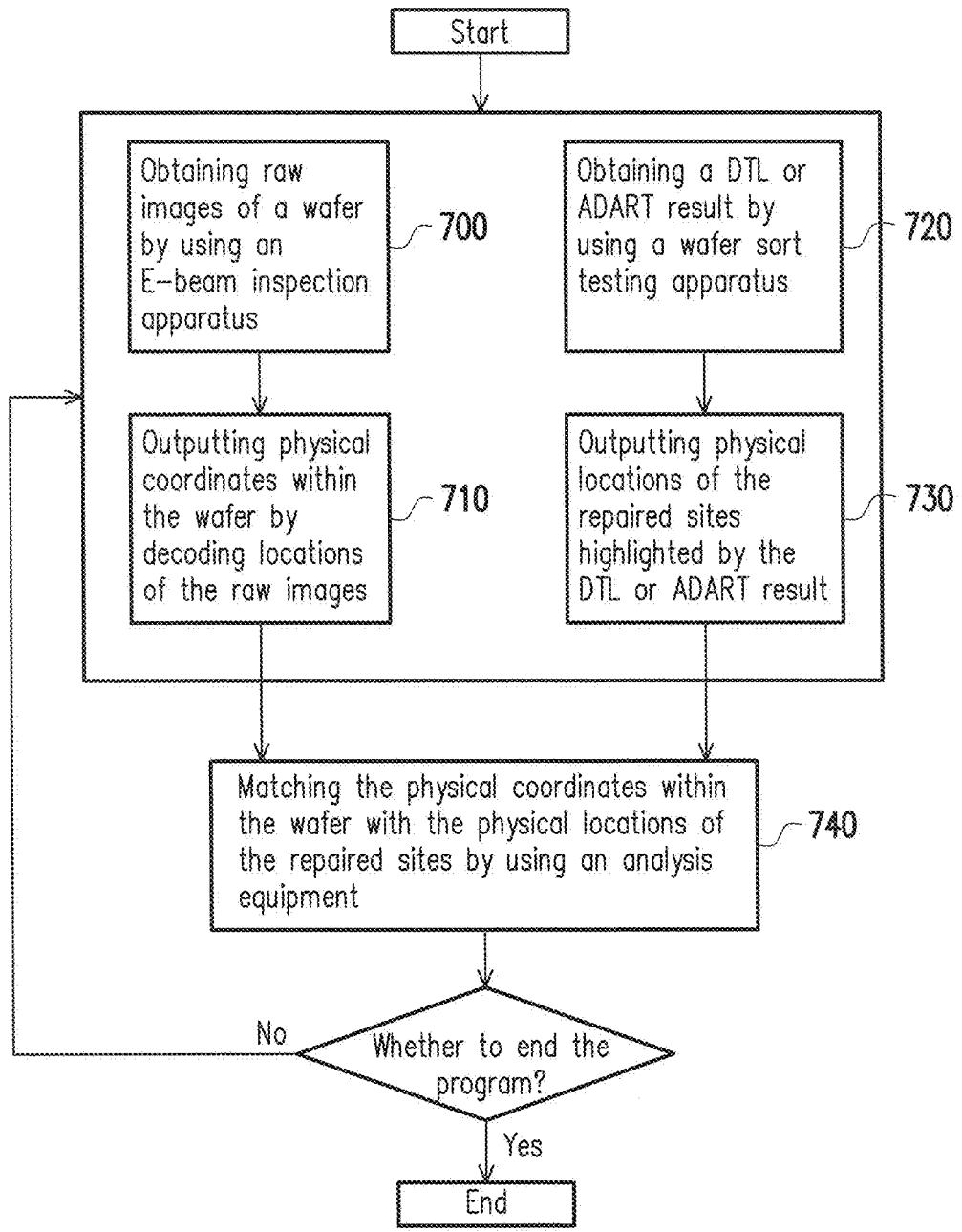
FIG. 7 is a diagram illustrating steps of detecting defects of wafer by WS according to another embodiment of the invention.

FIG. 7 is a diagram illustrating steps of detecting defects of wafer by WS according to another embodiment of the invention.

The steps 700 to 710 and the steps 720 to 730 may be performed in sequence or simultaneously. In step 700, raw images of a wafer are obtained by using an E-beam inspection apparatus. The E-beam inspection apparatus, for example, includes an E-beam inspection tool, a bright field inspection equipment with a light source having a wavelength of 150 nm to 800 nm, a dark field inspection equipment with a laser light source, or a scanning electron microscope review tool. The raw images may include defects in each layer within one single wafer and physical coordinates of the defects within the wafer.

In step 710, physical coordinates within the wafer is output by decoding locations of the raw images. The physical coordinates are in form of GDSII or OASIS coordinates, for instance.

In step 720, a DTL or ADART result is obtained by using a wafer sort (WS) testing apparatus, wherein repaired sites in the wafer are highlighted by the DTL or ADART result. The wafer sort testing apparatus may be wafer prober, for example. Each of the repaired sites, for instance, includes at least one sector or few sectors. In response to the step 710, repair signature or and defect signature can be displayed. For example, the defect signature will be reported by different color, and one color represents one type of defects. The defect signature may be accumulated into one and/or split up into different defect types or same defect from different layers.

In step 730, physical locations of the repaired sites are output. In detail, the DTL or ADART result includes the data about physical locations of the repaired sites, and thus the coordinates of the physical locations of the repaired sites are output. In WS, the output physical location is also called 'Failure Bin' of the repaired sites.

Figure 8:
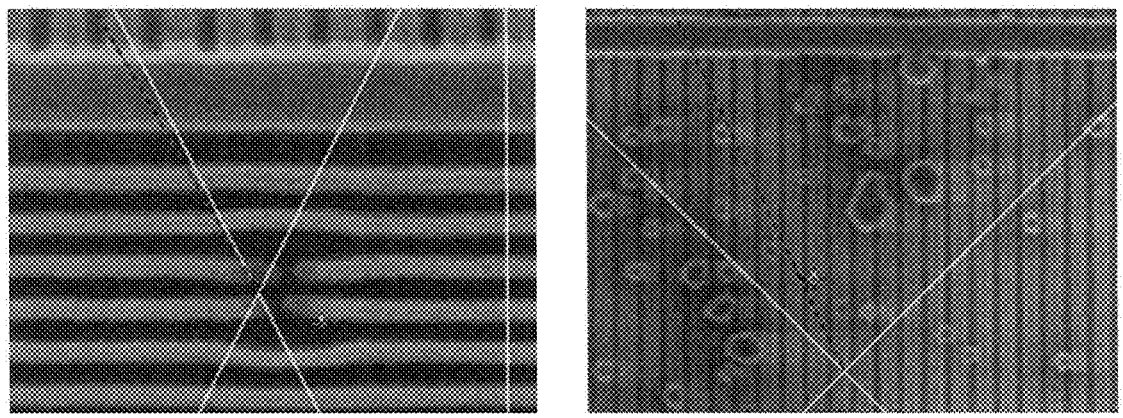
FIG. 8 is an SEM image of actual defects in the embodiment of the invention.

In step 740, the physical coordinates within the wafer are matched with the physical locations of the repaired sites by using an analysis equipment, and thereby generating a data correlating with defects at the repaired sites. In the embodiment, the data correlating with the defects at the repaired sites may be a killing ratio, which is compared an amount of the repaired sites having same failure to the total number of the repaired sites. The data correlating with the defects at the repaired sites may be pattern of interest (POI) and defect of interest (DOI). In addition, according the data correlating with defects at the repaired sites, the image of defects may be shown as FIG. 8, and the type of defects may be identified.

After the step 740, the program may be ended, but it is not limited herein. In necessary, the steps 700-740 may be repeated to perform several inspections.

In one exemplary embodiment, the steps 700-740 may be repeated to detect the defects at different layers of the wafer. In another exemplary embodiment, the steps 700-740 may be repeated to detect the defects at same layer of the wafer in different lots. In yet another exemplary embodiment, the steps 700-740 may be repeated to detect the defects at same site of different layers by batch run, and thereby highlighting a superposition site with different failure repair bin.

Based on above, the invention is capable of getting the repair sites vs. defect correlation and the repair bin vs. killing ratio, such that the yield impact layers and DOI are found out. Moreover, WS testing is performed in the invention, so there is no need to set up other testing recipe. Since each of repaired sites according to WS is ranged in few sectors, it may be easy to pixelize and then match with (defect/repair) signature. In comparison with the detection to bit, it may get testing data taster, and the signature matching is helpful to resolve some issues hide in huge database.

Although the invention has been described with reference to the above exemplary embodiments, it will be apparent to one of ordinary skill in the art that modifications to the described exemplary embodiments may be made without departing from the spirit of the invention. Accordingly, the scope of the invention will be defined by the attached claims and not by the above detailed descriptions.

What is claimed is:

1. A method for detecting defects of wafer by wafer sort, comprising:
   a. providing a wafer sort testing apparatus, wherein the wafer sort testing apparatus comprises a wafer prober, a data processing module coupled to the wafer prober, and an output module and a display coupled to the data processing module respectively;
   b. using the wafer prober to test a wafer for obtaining a plurality of physical locations of repaired sites;
   c. using the data processing module to highlight the plurality of repaired sites obtained from the wafer prober;
   d. using the display to show a defect signature from the plurality of physical locations of the repaired sites at step c, wherein the defect signature is reported by different color, and one color represents one type of the defects;
   e. using the output module to output the plurality of physical locations of the repaired sites highlighted by the data processing module; and
   f. using an analysis equipment to match the output physical locations with a graphic data system (GDS) design layout coordinate of the wafer so as to generate a data correlating with defects at the repaired sites.

2. The method for detecting defects of wafer by wafer sort of claim 1, wherein the GDS design layout coordinate is in form of GDSII or OASIS coordinates.

3. The method for detecting defects of wafer by wafer sort of claim 1, wherein each of the repaired sites includes at least one sector.

4. The method for detecting defects of wafer by wafer sort of claim 1, further comprising repeating steps b-f to detect the defects at different layers of the wafer.

5. The method for detecting defects of wafer by wafer sort of claim 1, further comprising repeating steps b-e to detect the defects at same layer of the wafer in different lots.

6. The method for detecting defects of wafer by wafer sort of claim 1, further comprising:
   repeating steps b-f to detect the defects at same site of different layers by batch run; and
   using the data processing module to highlight a superposition site with different failure repair bin.

7. The method for detecting defects of wafer by wafer sort of claim 1, wherein the data correlating with the defects at the repaired sites comprises a killing ratio by comparing an amount of the repaired sites having same failure to the total number of the repaired sites.

8. The method for detecting defects of wafer by wafer sort of claim 1, wherein the data correlating with the defects at the repaired sites comprises pattern of interest (POI) and defect of interest (DOI).

9. The method for detecting defects of wafer by wafer sort of claim 1, further comprising using the display to show a repair signature at step d.

10. A method for detecting defects of wafer by wafer sort, comprising:
    a. using an E-beam inspection apparatus to obtaining a plurality of raw images of a wafer;
    b. outputting a plurality of physical coordinates within the wafer by decoding a plurality of locations of the raw images;
    c. providing a wafer sort testing apparatus, wherein the wafer sort testing apparatus comprises a wafer prober, a data processing module coupled to the wafer prober, and an output module coupled to the data processing module;
    d. using the wafer prober to test a wafer for obtaining a plurality of physical locations of repaired sites;
    e. using the data processing module to highlight the plurality of repaired sites obtained from the wafer prober;
    f. using the display to show a defect signature from the plurality of physical locations of the repaired sites at step e, wherein the defect signature is reported by different color, and one color represents one type of the defects;
    g. using the output module to output the plurality of physical locations of the repaired sites highlighted by the data processing module; and
    h. using an analysis equipment to match the output physical coordinates within the wafer with the physical locations of the repaired sites so as to generate a data correlating with defects at the repaired sites.

11. The method for detecting defects of wafer by wafer sort of claim 10, wherein the physical coordinates are in form of GDSII or OASIS coordinates.

12. The method for detecting defects of wafer by wafer sort of claim 10, wherein each of the repaired sites includes at least one sector.

13. The method for detecting defects of wafer by wafer sort of claim 10, further comprising repeating steps a-h to detect the defects at different layers of the wafer.

14. The method for detecting defects of wafer by wafer sort of claim 10, further comprising repeating steps a-h to detect the defects at same layer of the wafer in different lots.

15. The method for detecting defects of wafer by wafer sort of claim 10, further comprising:
repeating steps a-h to detect the defects at same site of different layers by batch run; and
using the data processing module to highlight a superposition site with different failure repair bin.

16. The method for detecting defects of wafer by wafer sort of claim 10, wherein the data correlating with the defects at the repaired sites comprises a killing ratio by comparing an amount of the repaired sites having same failure to the total number of the repaired sites.

17. The method for detecting defects of wafer by wafer sort of claim 10, wherein the data correlating with the defects at the repaired sites comprises pattern of interest (POI) and defect of interest (DOI) after step h.

18. The method for detecting defects of wafer by wafer sort of claim 10, further comprising using the display to show a repair signature at step f.

19. The method for detecting defects of wafer by wafer sort of claim 10, wherein the E-beam inspection apparatus comprises an E-beam inspection tool, a bright field inspection equipment with a light source having a wavelength of 150 nm to 800 nm, a dark field inspection equipment with a laser light source, or a scanning electron microscope review tool.

20. A system for detecting defects of a wafer, comprising:
a design layout database unit storing a graphic data system (GDS) design layout coordinate of the wafer;
an analysis equipment coupled to the design layout database unit; and
a wafer sort (WS) testing apparatus coupled to the analysis equipment and comprising:
a wafer prober for testing the wafer to obtain a plurality of physical locations of repaired sites;
a data processing module coupled to the wafer prober and highlighting the plurality of repaired sites obtained from the wafer prober;
a display coupled to the data processing module and showing a defect signature from the plurality of physical locations of the repaired sites, wherein the defect signature is reported by different color, and one color represents one type of the defects; and
an output module coupled to the data processing module and outputting the plurality of physical locations of the repaired sites into the analysis equipment, such that the GDS design layout coordinate is matched with the output physical locations of the repaired sites by the analysis equipment so as to generate a data correlating with defects at the repaired sites.

21. The system for detecting defects of the wafer of claim 20, wherein the GDS design layout coordinate is in form of GDSII or OASIS coordinates.

22. The system for detecting defects of the wafer of claim 20, wherein each of the repaired sites includes at least one sector.

23. The system for detecting defects of the wafer of claim 20, wherein the data correlating with the defects at the repaired sites comprises a killing ratio by comparing an amount of the repaired sites having same failure to the total number of the repaired sites.

24. The system for detecting defects of the wafer of claim 20, wherein the data correlating with the defects at the repaired sites comprises pattern of interest (POI) and defect of interest (DOI).

25. The system for detecting defects of the wafer of claim 20, wherein the display further shows a repair signature.

26. The system for detecting defects of the wafer of claim 20, further comprising an E-beam inspection apparatus coupled to the analysis equipment, the E-beam inspection apparatus obtains a plurality of raw images of the wafer and outputs a plurality of physical coordinates within the wafer into the analysis equipment by decoding a plurality of locations of the raw images.

27. The system for detecting defects of the wafer of claim 26, wherein the E-beam inspection apparatus comprises an E-beam inspection tool, a bright field inspection equipment with a light source having a wavelength of 150 nm to 800 nm, a dark field inspection equipment with a laser light source, or a scanning electron microscope review tool.

* * * * *